(12) United States Patent
Zhu et al.

(10) Patent No.: US 10,746,195 B2
(45) Date of Patent: Aug. 18, 2020

(54) SUPPORTING BRACKET FOR FAN AND COOLING DEVICE USING THE SAME

(71) Applicant: HONGFUJIN PRECISION ELECTRONICS (TIANJIN) CO., LTD., Tianjin (CN)

(72) Inventors: Xiao-Chuang Zhu, Tianjin (CN); Wen-Hu Lu, Tianjin (CN)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 211 days.

(21) Appl. No.: 15/970,181

(22) Filed: May 3, 2018

(65) Prior Publication Data

US 2019/0234426 A1     Aug. 1, 2019

(30) Foreign Application Priority Data

Jan. 31, 2018   (CN) .......................... 2018 1 0092388

(51) Int. Cl.
| | |
|---|---|
| *F04D 29/64* | (2006.01) |
| *H05K 7/20* | (2006.01) |
| *F04D 29/52* | (2006.01) |
| *F04D 25/08* | (2006.01) |
| *F04D 29/60* | (2006.01) |
| *F04D 25/06* | (2006.01) |

(52) U.S. Cl.
CPC ....... *F04D 29/646* (2013.01); *F04D 25/0613* (2013.01); *F04D 25/08* (2013.01); *F04D 29/522* (2013.01); *F04D 29/601* (2013.01); *H05K 7/20172* (2013.01)

(58) Field of Classification Search
CPC .... F04D 25/0613; F04D 29/601; F04D 25/08; F04D 29/522; H05K 7/20172
USPC .......................................................... 415/126
See application file for complete search history.

(56) References Cited

U.S. PATENT DOCUMENTS

| | | | |
|---|---|---|---|
| 6,592,327 B2* | 7/2003 | Chen ..................... | F04D 25/166 415/213.1 |
| 2008/0075589 A1* | 3/2008 | Chen ..................... | F04D 29/582 415/213.1 |
| 2010/0108847 A1* | 5/2010 | Li ............................ | G06F 1/20 248/309.1 |
| 2010/0232976 A1* | 9/2010 | Li ............................ | G06F 1/20 416/244 R |
| 2011/0135461 A1* | 6/2011 | Li ......................... | F04D 29/601 415/213.1 |
| 2012/0027580 A1* | 2/2012 | Lu ....................... | F04D 25/0613 415/214.1 |
| 2012/0148397 A1* | 6/2012 | Tsai ....................... | F03D 80/00 415/213.1 |

(Continued)

*Primary Examiner* — J. Todd Newton
(74) *Attorney, Agent, or Firm* — ScienBiziP, P.C.

(57) ABSTRACT

A bracket attached to a cooling device can mount a fan. The supporting bracket includes a first fixing plate, a second fixing plate, a first supporting unit, a second supporting unit, and a ventilation panel. The first fixing plate is fixed to an air outlet side of the fan, the second fixing plate is fixed to an air inlet side of the fan and parallel to the first fixing plate. The first supporting unit and the second supporting unit are between the first fixing plate and the second fixing plate and respectively mounted to two opposite sides of the fan. The ventilation panel is defined at an outer surface of the second fixing plate and mounted to the second fixing plate.

16 Claims, 4 Drawing Sheets

(56) References Cited

U.S. PATENT DOCUMENTS

| | | | | |
|---|---|---|---|---|
| 2012/0163971 A1* | 6/2012 | Chiu | .................... | F04D 29/601 |
| | | | | 415/213.1 |
| 2012/0230819 A1* | 9/2012 | Chiu | .................. | F04D 25/0613 |
| | | | | 415/213.1 |
| 2013/0108436 A1* | 5/2013 | He | ....................... | F04D 19/002 |
| | | | | 415/213.1 |
| 2014/0147312 A1* | 5/2014 | Lu | ...................... | F04D 25/0613 |
| | | | | 417/423.14 |

* cited by examiner

SUPPORTING BRACKET FOR FAN AND COOLING DEVICE USING THE SAME

FIELD

The subject matter herein generally relates to a supporting bracket for fan and cooling devices using the supporting bracket.

BACKGROUND

In order to realize hot-swap function of a fan, the main body of the fan and the plug of the fan cable need to be integrated. A common bracket design is to wrap the fan with multiple plastic parts, and then the plastic parts can be fastened with screws. The assembly process is complex and a large number of parts are needed, which will increase costs and is a waste of resources. Improvement in the art is preferred.

BRIEF DESCRIPTION OF THE DRAWINGS

Implementations of the present disclosure will now be described, by way of example only, with reference to the attached figures.

DETAILED DESCRIPTION

Figure 1:
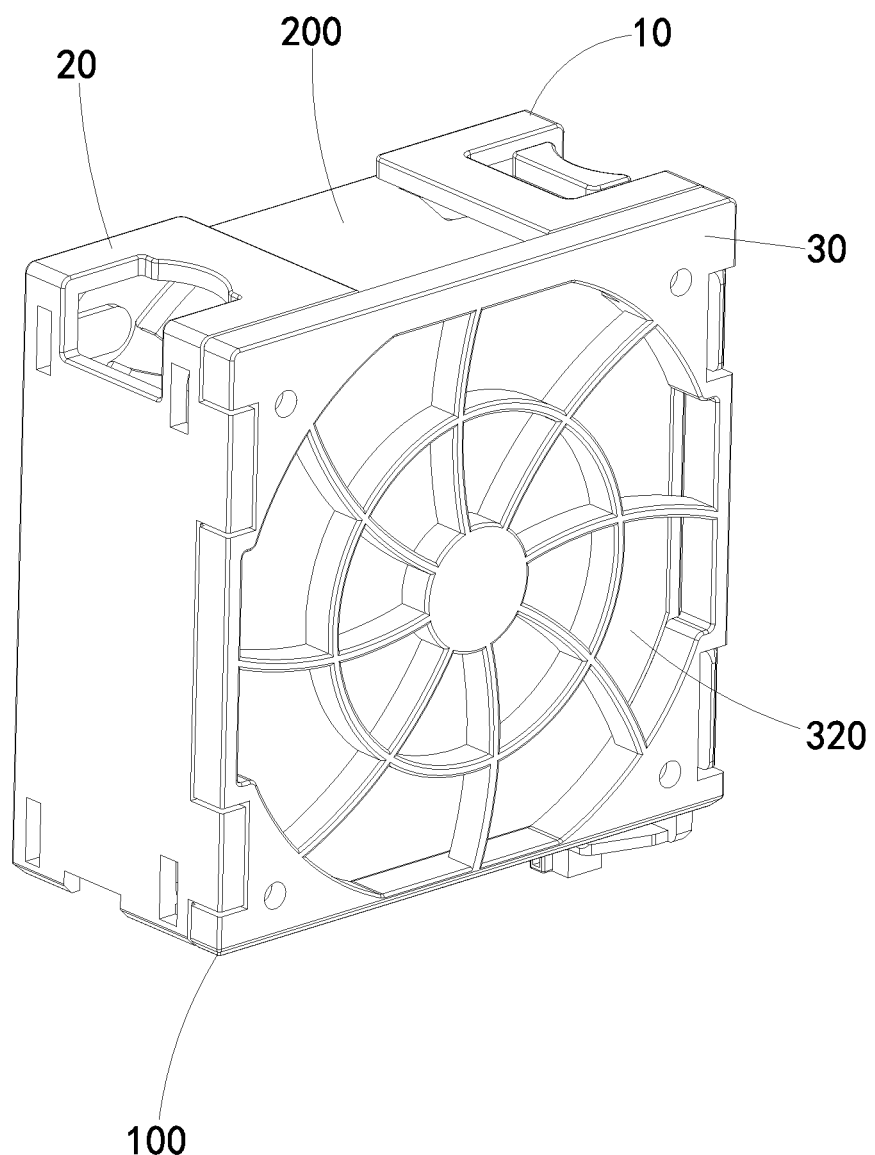
FIG. 1 illustrates an isometric view of an exemplary embodiment of a cooling device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "comprising" means "including, but not necessarily limited to"; it specifically indicates open-ended inclusion or membership in a so-described combination, group, series, and the like.

Figure 2:
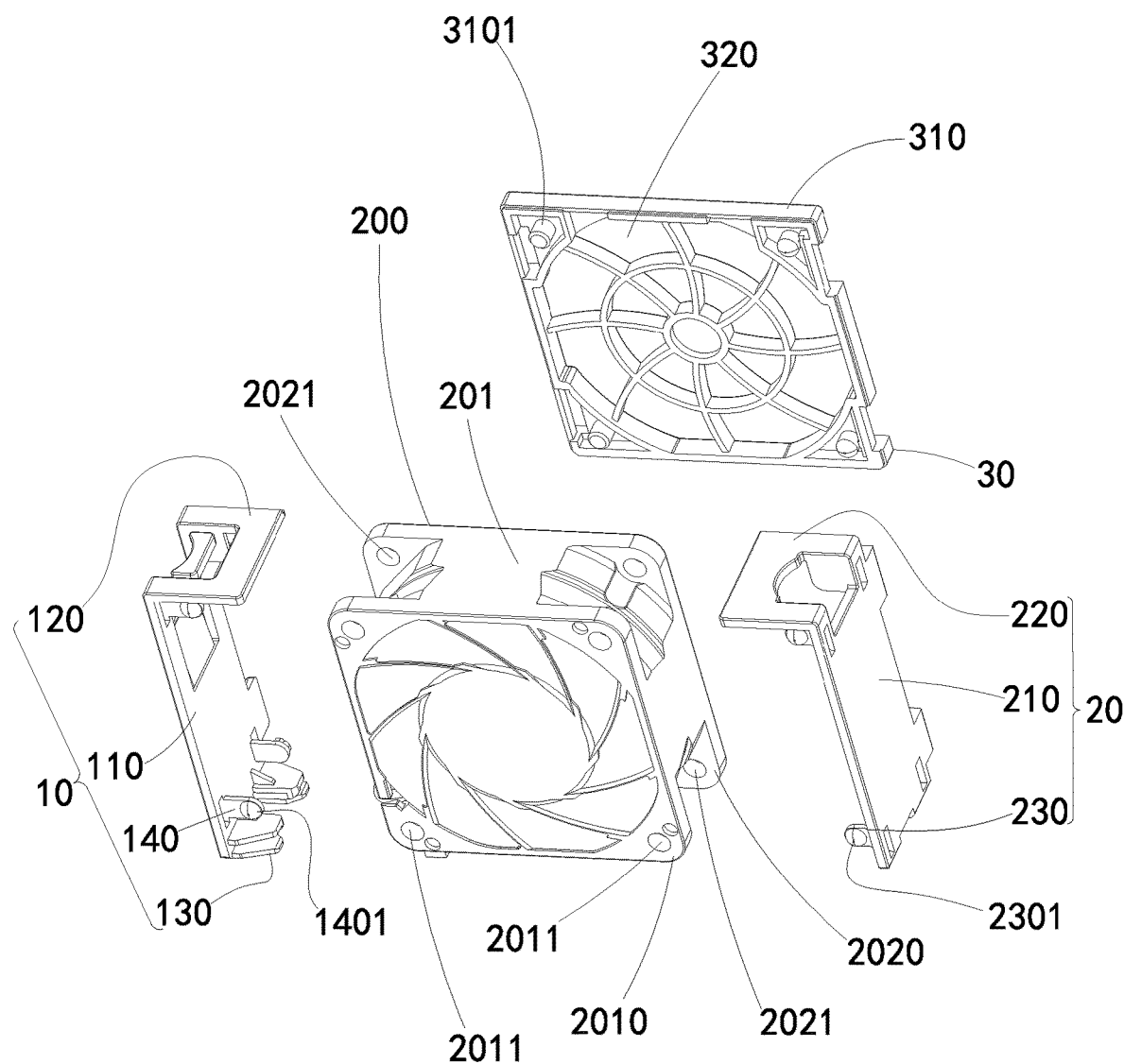
FIG. 2 illustrates an exploded view of the cooling device of FIG. 1.
Figure 3:
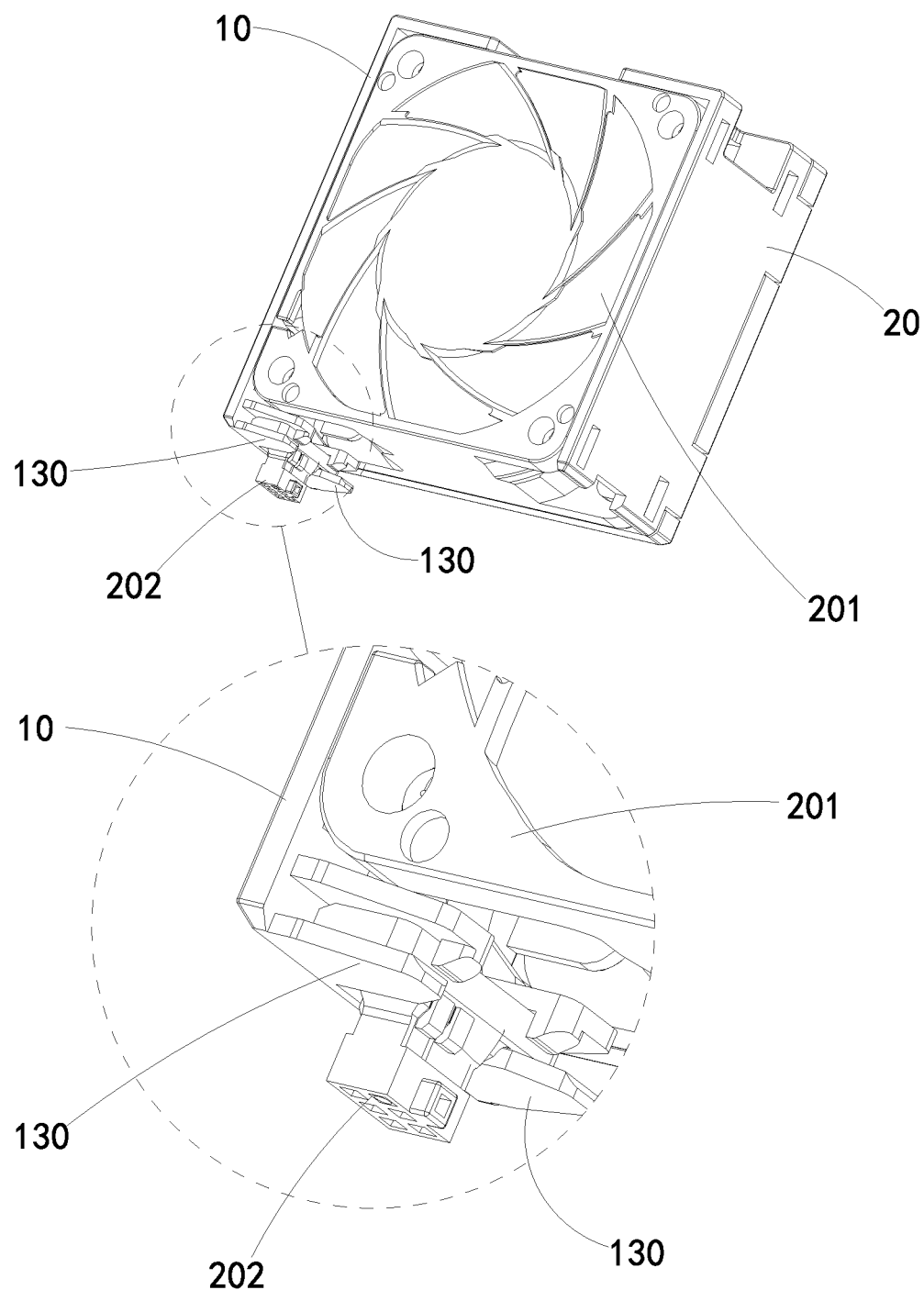
FIG. 3 illustrates an isometric view of the cooling device of FIG. 1 from another viewpoint.

FIGS. 1 to 3 illustrate a cooling device 500. The cooling device 500 includes a fan 200 and a supporting bracket 100 for mounting the fan 200.

The fan 200 includes a main body 201, cables (not shown) connected to the main body 201, and a connector 202. The supporting bracket 100 can also be used to mount the connector 202.

In FIG. 2, the supporting bracket 100 includes a first fixing plate 2010, a second fixing plate 2020, a first supporting unit 10, a second supporting unit 20, and a ventilation panel 30.

The first fixing plate 2010 is defined at an air outlet side of the fan 200. The second fixing plate 2020 is defined at an air inlet side of the fan and parallel to the first fixing plate. The fan 200 can be sandwiched between the first fixing plate 2010 and the second fixing plate 2020.

In at least one exemplary embodiment, the fan 200, the first fixing plate 2010 and the second fixing plate 2020 can be integrated together.

The first supporting unit 10 and the second supporting unit 20 are between the first fixing plate 2010 and the second fixing plate 2020. The first supporting unit 10 and the second supporting unit 20 are respectively mounted to opposite sides of the fan 200. The ventilation panel 30 is defined at an outer surface of the second fixing plate 2020 and mounted to the second fixing plate 2020.

In at least one exemplary embodiment, the first fixing plate 2010 defines a plurality of first fixing holes 2011, the second fixing plate 2020 defines a plurality of second fixing holes 2021. The first supporting unit 10 includes a plurality of first fixing members 140 corresponding to the plurality of first fixing holes 2011 and the plurality of second fixing holes 2021. The second supporting unit 20 includes a plurality of second fixing members 230 corresponding to the plurality of first fixing holes 2011 and the plurality of second fixing holes 2021.

The first fixing member 140 includes a first fixing pillar 1401 configured to insert in the first fixing hole 2011 or the second fixing hole 2021. The second fixing member 230 includes a second fixing pillar 2301 configured to be inserted in the first fixing hole 2011 or the second fixing hole 2021.

The first supporting unit 10 is between the first fixing plate 2010 and the second fixing plate 2020, and mounted to the first fixing plate 2010 and the second fixing plate 2020 through the first fixing pillar 1401, the first fixing hole 2011, and the second fixing hole 2021.

Similarly, the second supporting unit 20 is between the first fixing plate 2010 and the second fixing plate 2020, and mounted to the first fixing plate 2010 and the second fixing plate 2020 through the second fixing pillar 2301, the first fixing hole 2011, and the second fixing hole 2021.

The ventilation panel 30 includes a third supporting plate 310 and a plurality of third fixing pillars 3101 fixed to the third supporting plate 310.

The third supporting plate 310 is mounted to the second fixing plate 2020 through the plurality of third fixing pillars 3101 and the second fixing holes 2021.

The third supporting plate 310 defines a plurality of air vents 320.

Figure 4:
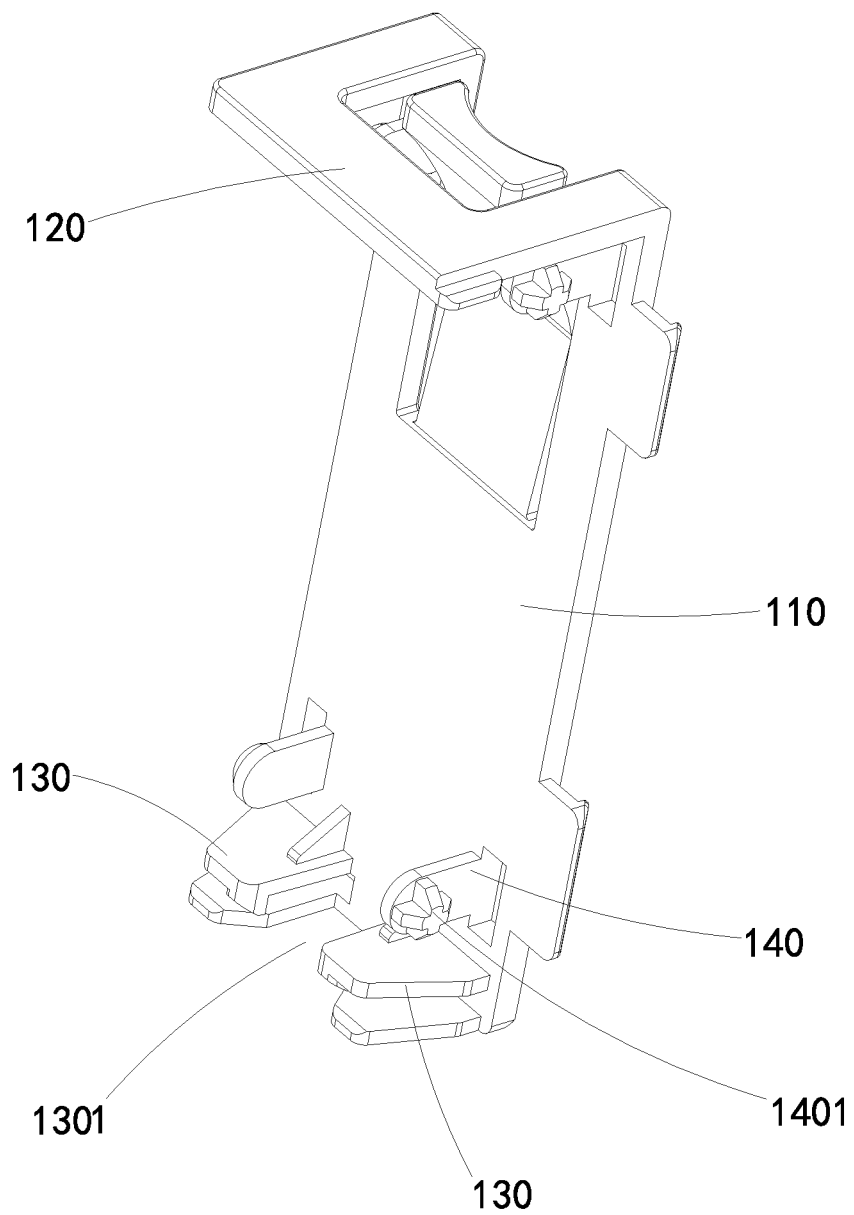
FIG. 4 illustrates an isometric view of a first supporting unit of the cooling device of FIG. 1.

Referring also to FIG. 4, the first supporting unit 10 can include a first supporting plate 110, a first 120, and a second 130.

The first supporting plate 110 has two opposing ends. The first clipping member 120 is perpendicularly connected to an end of the first supporting plate 110. The second clipping member 130 is perpendicularly connected to the other end of the first supporting plate 110, and the second clipping member 130 is parallel to the first clipping member 120.

The first supporting unit 10 is mounted to the fan 200 through the first clipping member 120 and the second clipping member 130.

The first supporting unit 10 can include two first fixing members 140. The two first fixing members 140 include two first fixing pillars 1401 extending towards opposite directions, and the two first fixing pillars 1401 respectively correspond to and inserted into the first fixing hole 2011 and the second fixing hole 2021.

The first supporting unit 10 can include two second clipping members 130 spaced apart from each other, and the two second clipping members 130 define a clipping slot 1301 for clipping the cables to the fan 200 or clipping to the connector 202 of the fan 200.

In FIG. 2, the second supporting unit 20 can include a second supporting plate 210 and a third clipping member 220.

The second supporting plate 210 includes two opposing ends. The third clipping member 220 is perpendicularly connected to an end of the second supporting plate 210. The plurality of second fixing members 230 are connected to the other end of the first supporting plate 2010, and the second supporting unit 20 is mounted to the fan 200 through the third clipping member 220.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A supporting bracket for mounting a fan, comprising:
a first fixing plate defined at an air outlet side of the fan;
a second fixing plate defined at an air inlet side of the fan and being parallel to the first fixing plate;
a first supporting unit;
a second supporting unit; and
a ventilation panel;
wherein the first supporting unit and the second supporting unit are between the first fixing plate and the second fixing plate and are respectively mounted to two opposite sides of the fan, the ventilation panel is mounted at and covering an outer surface of the second fixing plate;
wherein the first supporting unit comprises:
a first supporting plate comprising two opposing ends;
a first clipping member perpendicularly connected to an end of the first supporting plate; and
a second clipping member perpendicularly connected to the other end of the first supporting plate and parallel to the first clipping member;
the first supporting unit is mounted to the fan through the first clipping member and the second clipping member.

2. The supporting bracket of claim 1, wherein the first fixing plate defines a plurality of first fixing holes; the second fixing plate defines a plurality of second fixing holes; the first supporting unit comprises a plurality of first fixing members corresponding to the plurality of first fixing holes and the plurality of second fixing holes; the second supporting unit comprises a plurality of second fixing members corresponding to the plurality of first fixing holes and the plurality of second fixing holes.

3. The supporting bracket of claim 2, wherein the first fixing member comprises a first fixing pillar configured to be inserted in and coupled to the first fixing hole or the second fixing hole; the second fixing member comprises a second fixing pillar configured to be inserted in and coupled to the first fixing hole or the second fixing hole.

4. The supporting bracket of claim 2, wherein the second supporting unit comprises:
a second supporting plate comprising two opposing ends; and
a third clipping member perpendicularly connected to an end of the second supporting plate;
the plurality of second fixing members are connected to the other end of the first supporting plate, and the second supporting unit is mounted to the fan through the third clipping member.

5. The supporting bracket of claim 2, wherein the ventilation panel comprises:
a third supporting plate; and
a plurality of third fixing pillars fixed to the third supporting plate;
wherein the third supporting plate is mounted to the second fixing plate through the plurality of third fixing pillars and the second fixing holes.

6. The supporting bracket of claim 5, wherein the third supporting plate defines a plurality of air vents.

7. The supporting bracket of claim 1, wherein the first supporting unit comprises two first fixing members, each first fixing member comprises two first fixing pillars extending towards opposite directions, and the two first fixing pillars respectively correspond and coupled to the first fixing hole and the second fixing hole.

8. The supporting bracket of claim 1, wherein the first supporting unit comprises two second clipping members space apart from each other, and the two second clipping members each define a clipping slot for clipping cables to the fan.

9. A cooling device comprising:
a fan comprising:
a main body; and
a supporting bracket for mounting the fan, comprising:
a first fixing plate defined at an air outlet side of the fan;
a second fixing plate defined at an air inlet side of the fan and parallel to the first fixing plate;
a first supporting unit;
a second supporting unit; and
a ventilation panel;
wherein the first supporting unit and the second supporting unit are between the first fixing plate and the second fixing plate and respectively mounted to two opposite sides of the fan, the ventilation panel is covered at an outer surface of the second fixing plate and mounted to the second fixing plate;
wherein the first supporting unit comprises:
a first supporting plate comprising two opposing ends;
a first clipping member perpendicularly connected to an end of the first supporting plate; and
a second clipping member perpendicularly connected to the other end of the first supporting plate and parallel to the first clipping member;
the first supporting unit is mounted to the fan through the first clipping member and the second clipping member.

10. The cooling device of claim 9, wherein the first fixing plate defines a plurality of first fixing holes; the second fixing plate defines a plurality of second fixing holes; the first supporting unit comprises a plurality of first fixing members corresponding to the plurality of first fixing holes and the plurality of second fixing holes; the second supporting unit comprises a plurality of second fixing members corresponding to the plurality of first fixing holes and the plurality of second fixing holes.

11. The cooling device of claim 10, wherein the first fixing member comprises a first fixing pillar configured to be inserted in and coupled to the first fixing hole or the second fixing hole; the second fixing member comprises a second fixing pillar configured to be inserted in and coupled to the first fixing hole or the second fixing hole.

12. The cooling device of claim 10, wherein the second supporting unit comprises:
a second supporting plate comprising two opposing ends; and
a third clipping member perpendicularly connected to an end of the second supporting plate;
the plurality of second fixing members are connected to the other end of the first supporting plate, and the second supporting unit is mounted to the fan through the third clipping member.

13. The cooling device of claim 10, wherein the ventilation panel comprises:
a third supporting plate; and
a plurality of third fixing pillars fixed to the third supporting plate;
wherein the third supporting plate is mounted to the second fixing plate through the plurality of third fixing pillars and the second fixing holes.

14. The cooling device of claim 13, wherein the third supporting plate defines a plurality of air vents.

15. The cooling device of claim 9, wherein the first supporting unit comprises two first fixing members, the two first fixing members comprise two first fixing pillars extending towards opposite directions, and the two first fixing pillars are respectively correspond with and inserted into the first fixing hole and the second fixing hole.

16. The cooling device of claim 9, wherein the first supporting unit comprises two second clipping members space apart from each other, and the two second clipping members define a clipping slot for clipping cables to the fan.

* * * * *